United States Patent [19]
Estes et al.

[11] Patent Number: 5,714,789
[45] Date of Patent: Feb. 3, 1998

[54] CIRCUIT BOARD-MOUNTED IC PACKAGE COOLING APPARATUS

[75] Inventors: Scott Estes; Deepak Swamy, both of Austin, Tex.

[73] Assignee: Dell U.S.A., L.P., Austin, Tex.

[21] Appl. No.: 755,388

[22] Filed: Nov. 22, 1996

Related U.S. Application Data

[63] Continuation of Ser. No. 374,320, Jan. 18, 1995, Pat. No. 5,625,227.

[51] Int. Cl.⁶ .................................................. H01L 27/14
[52] U.S. Cl. ........................ 257/414; 257/415; 257/712
[58] Field of Search .................................. 257/414, 415, 257/417, 419, 714; 361/712, 699, 719

[56] References Cited

U.S. PATENT DOCUMENTS

| | | | |
|---|---|---|---|
| 4,990,987 | 2/1991 | Boucher et al. | 257/467 |
| 5,373,414 | 12/1994 | Barrett | 257/714 |
| 5,604,363 | 2/1997 | Ichihashi | 257/417 |

*Primary Examiner*—Wael Fahmy
*Assistant Examiner*—Roy Potter
*Attorney, Agent, or Firm*—Haynes and Boone, L.L.P.

[57] ABSTRACT

In a circuit board/IC package assembly the die cavity in the IC package body portion is filled with a thermally conductive liquid to substantially facilitate the transfer of operational die heat toward the inner, lid side of the IC package that faces the circuit board. To dissipate the die heat received by the die cavity lid, a spaced series of metal-plated through holes are formed in the circuit board. The metal plating portions of the through holes are engaged with an internal ground plane structure within the circuit board, and are thermally coupled to the IC package die cavity lid. Accordingly, during operation of the IC package, die heat is conducted to the ground plane structure sequentially through the die cavity liquid, the cavity lid, and the metal-plated through holes. In another embodiment of the assembly, the circuit board through holes are replaced with a circuit board opening through which a heat sink structure passes, the heat sink structure being thermally coupled on one side thereof to the die cavity lid. The other side of the heat sink structure engages a metal chassis section which interiorly engages the outer plastic housing wall of a computer.

2 Claims, 2 Drawing Sheets

CIRCUIT BOARD-MOUNTED IC PACKAGE COOLING APPARATUS

This is a continuation of application(s) Ser. No. 08/374,320 filed on Jan. 18, 1995, now U.S. Pat. No. 5,625,227.

BACKGROUND OF THE INVENTION

The present invention generally relates to circuit board apparatus, and more particularly relates to apparatus and methods for cooling of integrated circuit (IC) packages mounted on circuit boards.

Under the conventional method by which integrated circuits are hermetically packaged, an internal cavity is formed within a multi-tiered substrate structure, typically of a ceramic material, and opens outwardly through a bottom side of the substrate structure. A die is then mounted on an upper side surface portion of the cavity and wire bonded to the various circuitry tiers of the substrate structure. After the die is operatively mounted in the cavity, the cavity is filled with an inert gas, such as nitrogen, and hermetically sealed using a lid member received in the bottom side cavity opening of the substrate structure. The completed IC package is then mounted, lid side down, on a side of a circuit board and appropriately connected to the board circuitry, for example by pins mounted on the substrate structure and inserted into corresponding holes in the circuit board.

Since the ceramic material of the IC package substrate structure has a considerably higher thermal conductivity than the inert gas within the die cavity, most of the die operational heat conducted outwardly through the balance of the IC package is conducted upwardly through the substrate portion directly above the die—only a relatively small amount of heat is conducted downwardly through the IC package. To facilitate the removal of this upwardly conducted heat, it is customary to mount a heat sink device on the top side of the IC package substrate. Typically, these heat sinks must be provided with large surface areas and accordingly undesirably impose constraints on already complex system cooling problems—for example within a computer housing in which the IC package/circuit board structure is mounted.

As can readily be seen from the foregoing, it would be highly desirable to provide improved apparatus and methods for more effectively removing operational heat from an IC package mounted on a side of a circuit board. It is accordingly an object of the present invention to provide such improved heat removal apparatus and methods.

SUMMARY OF THE INVENTION

In carrying out principles of the present invention, in accordance with a preferred embodiment thereof, electronic apparatus is provided in the form of a circuit board having first and second opposite sides, and an integrated circuit (IC) package mounted on the first circuit board side. The IC package includes a body portion having a first side facing the first circuit board side and having an opening, an opposite second side, and a cavity extending from the opening through the body portion toward its second side. A heat generating die is operatively mounted in the cavity and is spaced apart from the body portion opening toward the second side of the body portion. A lid member is sealingly received in the body portion opening.

In accordance with a key aspect of the present invention relative to the IC package, a thermally conductive liquid is disposed within and fills the cavity and serves to conduct die heat therethrough to the lid member. Preferably, the liquid has the further physical characteristics Of being chemically inert, electrically insulative and having a relatively low coefficient of thermal expansion. Representatively, the liquid may be an inert fluorocarbon-based liquid or an inert vacuum pump fluid.

Because of the unique use of a thermally conductive liquid in the die cavity, as opposed to the conventional use of an inert gas such as nitrogen or highly purified air, a substantial portion of the operational die heat is transferred to the lid member. To facilitate the removal of this heat, heat dissipation means are thermally coupled to the lid member, extend therefrom through the circuit board, and are operative to conduct die heat from the second body portion side through the circuit board toward its second side.

In one representative form thereof, the heat dissipation means include a spaced series of metal-plated through holes extending through the circuit board, with the metal plating portions of the through holes engaging an interior ground plane structure within the circuit board and being thermally coupled to the IC package lid member. Accordingly, a portion of the operational die heat conducted to the interior ground plane structure of the circuit board. Die heat dissipation may be augmented by the securement of a heat sink structure to the second side of the IC package body portion and/or the securement of a heat sink structure to the second side of the circuit board in thermal communication with the metal plating portions of the through holes therein.

In another representative form thereof, the heat dissipation means include, in place of the plated through holes, an opening formed in the circuit board in general alignment with the lid member, and a heat sink structure thermally coupled on one side thereof to the lid member and extending through the circuit board opening. The opposite side of this heat sink structure may be thermally coupled to a metal chassis section that interiorly engages the outer plastic housing wall of a computer.

According to another feature of the invention, sensing means are disposed within the die cavity and are operative to output a control signal indicative of die cavity liquid temperature higher than a predetermined maximum temperature. This control signal may be utilized to automatically trigger a corrective cooling action such as, for example, the energization of an appropriate system cooling fan. In a preferred embodiment thereof, the sensing means include a pressure transducer disposed within the die cavity liquid.

DETAILED DESCRIPTION

Figure 1:
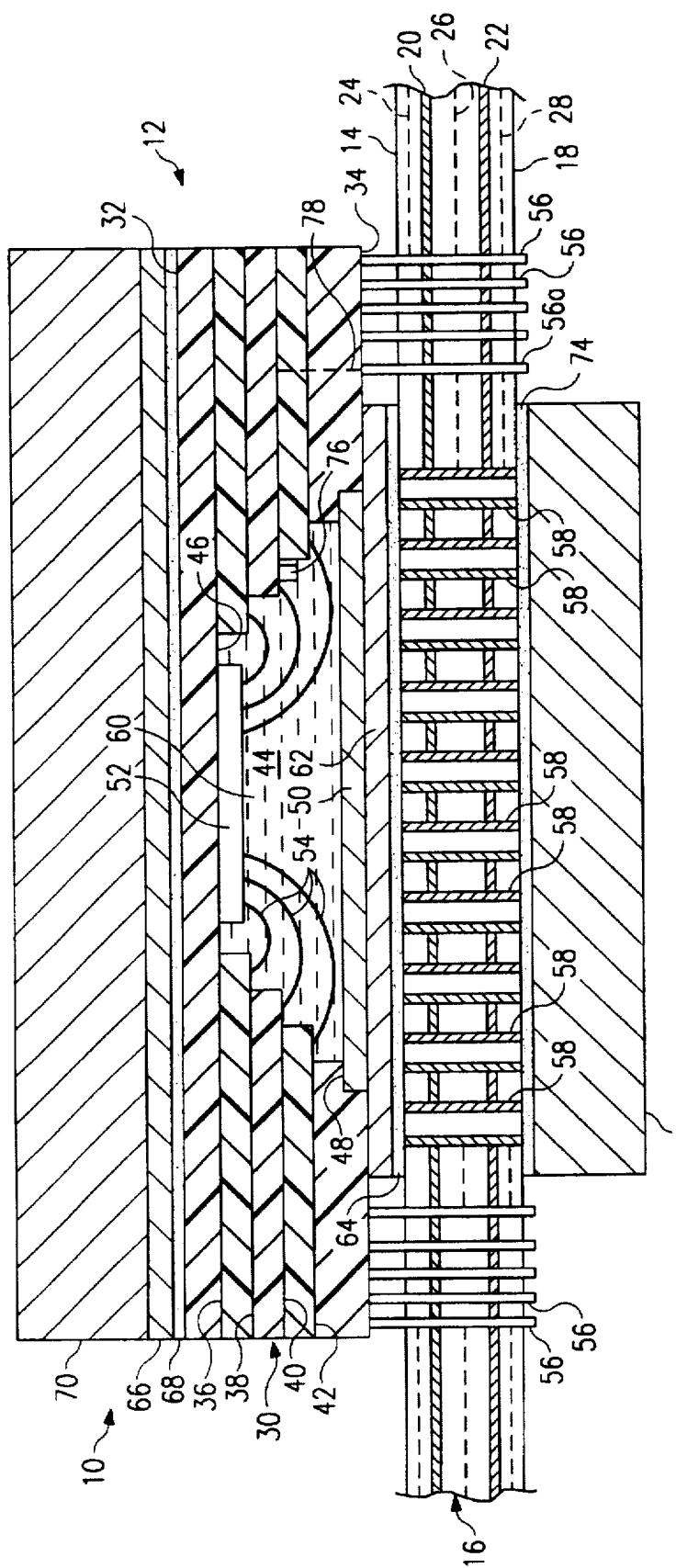
FIG. 1 is a simplified schematic cross-sectional view through a representative circuit board having mounted thereon an integrated circuit. (IC) package provided with improved operational cooling using apparatus and methods embodying principles of the present invention.

Cross-sectionally illustrated in somewhat schematic form in FIG. 1 is an improved circuit board assembly 10 that embodies principles of the present invention and includes a specially designed integrated circuit (IC) package 12 operatively mounted on the top side 14 of a circuit board 16 having a bottom side 18 parallel to the top side 14, and a vertically spaced pair of interior metal ground planes 20 and 22 parallel to sides 16 and 18 and interdigitated with various interior circuitry tiers 24, 26 and 28.

The IC package 12 has a generally rectangular dielectric body 30 which is preferably formed from a ceramic or plastic material and has top and bottom sides 32,34 and a vertically spaced series of interior circuitry tiers 36,38,40 and 42. Centrally disposed within the IC package body 30 is a cavity 44 that has an upper side surface 46 and an opening 48 disposed in the bottom side 34 of the body 30. The die cavity opening 48 is covered by a metal lid member 50 received and hermetically sealed within the opening 48. A die 52 is suitably secured to the upper cavity side surface 46 and is wire-bonded in a conventional manner, as at 54, to the body, circuitry tiers 36,38,40,42.

Outwardly circumscribing the die cavity opening 48 are a series of connector pins 56 that project downwardly from the bottom side 34 of the IC package body 30 and are received in corresponding openings in the circuit board 16. In a conventional manner, the pins 56 electrically couple the circuitry of the die 52 to the circuit board tiers 24,26,28 via the wire bonds 54 and the IC body circuitry tiers 36,38,40 and 42. For purposes later described, the circuit board has formed therein a spaced series of metal-plated through holes 58 disposed generally beneath the die cavity lid 50 and outwardly circumscribed by the pins 56. The metal plating of each of the through holes 58 is in direct contact with each of the metal ground planes 20,22 within the interior of the circuit board 16.

According to a key aspect of the present invention, in contrast to conventional IC package construction techniques the die cavity 44 is not filled with an inert gas such as nitrogen or highly purified air. Instead, the die cavity 44 is filled with a liquid 60 that (1) is thermally conductive, (2) is chemically inert, (3) is electrically insulative, and (4) has a low coefficient of thermal expansion. A preferred liquid having these characteristics is an inert fluorocarbon-based liquid manufactured under the trade name "Fluorinert" by the 3M Manufacturing Company. Another suitable liquid having these characteristics is a vacuum pump liquid such as that manufactured under the trade name "Crytox" by the DuPont Company.

In a conventional IC package whose die cavity is filled with nitrogen, highly purified air, or another inert gas, the solid IC package body portion directly above the die has a considerably higher thermal conductivity than the inert gas within the die cavity does. Accordingly, only a rather negligible portion of the total die heat transferred to the IC package body is downwardly transmitted toward the circuit board upon which the IC package is mounted—most of the die heat passing through the IC package body is transmitted upwardly to a central portion of its top side directly above the die.

In the present invention, however, due to the greatly increased thermal conductivity of the liquid 60, a much larger portion of the operational die heat is conducted downwardly through the liquid 60 to the metal lid 50. To facilitate the dissipation of this downwardly conducted die heat, a metal heat spreader plate 62 is suitably secured to the bottom side 34 of the IC package body 30, with the metal die cavity lid 50 being in direct thermal engagement with a central top side portion of the plate 62. The bottom side of the plate 62 is placed in efficient thermal contact with the top ends of the metal-plated circuit board through holes 58 by a layer of electrically and thermally conductive adhesive material 64.

Due to this thermal coupling of the bottom side of the IC package body 30 to the top ends of the metal-plated through holes 58, and the substantially increased thermal conductivity of the die cavity liquid 60, a substantial portion of the operational heat generated by the die 52 is transmitted to the metal plating portions of the through holes 58, and then from such metal plating portions to the metal ground planes 20 and 22 within the interior of the circuit board 16. This unique use of the ground planes 20,22 as heat dissipation means can advantageously disperse several watts of operational die heat. Additionally, due to the fact that a secondary ground path is established by virtue of the plated throughholes 58, the overall system is quieter from the standpoint of radiated emissions.

Of course, a reduced amount of operational die heat will still be conducted upwardly through the dielectric body 30 to its top side 32—primarily through a dielectric body portion directly above the die 52. To dissipate this heat a metal heat spreader plate 66 is secured to the top side 32 of the IC package body 30 with a layer of thermally conductive adhesive material 68, and is additionally secured to the bottom side of a suitable metal heat sink 70.

Because of the substantially increased downward dissipation of operational die heat provided by the present invention, the heat sink 70 can be markedly smaller than typically required for a similarly sized conventional IC package. If additional dissipation of the downwardly transferred die heat is needed, an auxiliary bottom side metal heat sink 72 may be secured to the bottom side 18 of the circuit board 16, over the lower ends of the metal-plated through holes 58, using a layer of electrically and thermally conductive adhesive material 74. In this manner, a first portion of the operational die heat downwardly transmitted to the upper ends of the metal through hole plating is conducted into the metal ground planes 20 and 22, and a second portion of the operational die heat downwardly transmitted to the upper ends of the metal through hole plating is conducted into the auxiliary heat sink 72.

The pressure, and thus the temperature, of the thermally conductive die cavity liquid 60 is continuously monitored by a small pressure transducer 76 mounted within the die cavity 44 and electrically coupled to one of the board circuitry tiers 24,26,28 sequentially via an IC body circuitry tier 40, a schematically depicted vertical circuit portion 78, and one of the connector pins 56a. When it senses a die cavity liquid temperature above a predetermined maximum level, the transducer 76 outputs a corresponding electrical signal which may be used to automatically take a temperature-corrective action such as energizing a system cooling fan.

Figure 2:
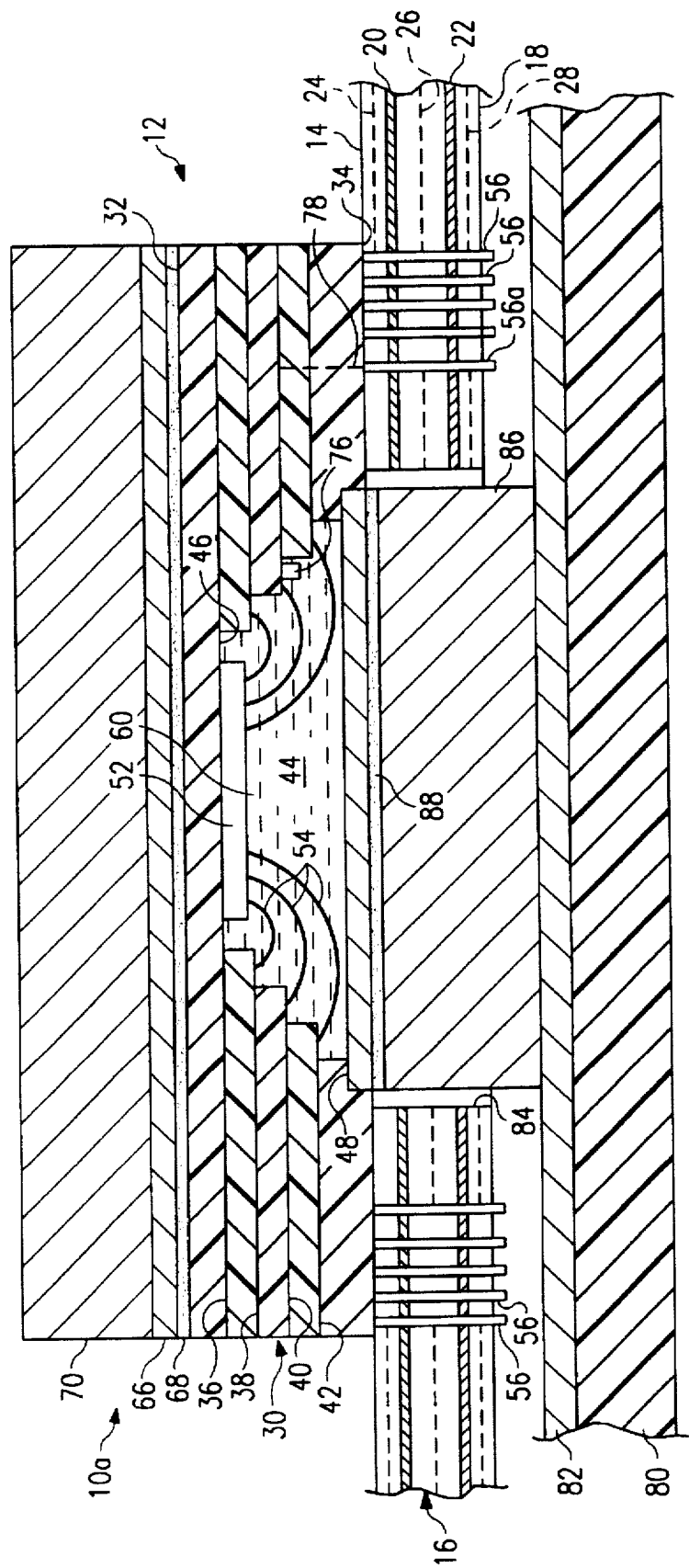
FIG. 2 is a simplified schematic cross-sectional view through an alternate embodiment of the circuit board/IC package assembly shown in FIG. 1.

Illustrated in FIG. 2 is an alternate embodiment 10a of the previously described circuit board assembly 10. The modified circuit board assembly 10a is representatively mounted in a computer housing having a plastic outer wall portion 80 that upwardly engages a metal chassis section 82 disposed beneath the circuit board assembly 10a.

Circuit board assembly 10a is similar to the previously described assembly 10 with the exception that the heat spreader plate 62 on the bottom side of the IC package body 30, the metal-plated circuit board through holes 58, and the auxiliary heat sink 72 are eliminated. Provided in place of the metal-plated through holes 56 is a rectangular opening 84 formed through the circuit board 16 directly beneath the die cavity lid 50. A metal heat sink 86 is received within the opening 84, has a bottom side in thermal engagement with the metal chassis portion 82, and has a top side coupled to the underside of the die cavity lid 50 by a layer of an electrically and thermally conductive adhesive material 88. In this manner, operational die heat transmitted downwardly through the die cavity liquid 60 is conducted to the outer plastic housing wall 80 sequentially via the adhesive material 88, the heat sink 86 and the metal chassis section 82.

The foregoing detailed description is to be clearly understood as being given by way of illustration and example only, the spirit and scope of the present invention being limited solely by the appended claims.

What is claimed is:

1. An integrated circuit package comprising:

a body portion having a first side with an opening therein, an opposite second side, and a cavity extending inwardly through said body portion from said opening toward said second side;

a heat generating die operatively mounted in said cavity and spaced apart from said opening toward said second side of said body portion;

a lid member sealingly received in said opening;

a thermally conductive liquid disposed within and filling said cavity and serving to conduct die heat therethrough to said lid member; and a pressure transducer disposed in said cavity and operative to output a control signal indicative of a temperature of said thermally conductive liquid in excess of a predetermined maximum temperature thereof, said control signal being utilized to automatically trigger performance of a corrective action.

2. The integrated circuit package of claim 1 wherein said corrective action comprises cooling said integrated circuit package.

* * * * *